April 9, 1963 D. M. JAHN 3,085,206
VERY LOW FREQUENCY WAVEFORM GENERATOR
Filed July 17, 1961
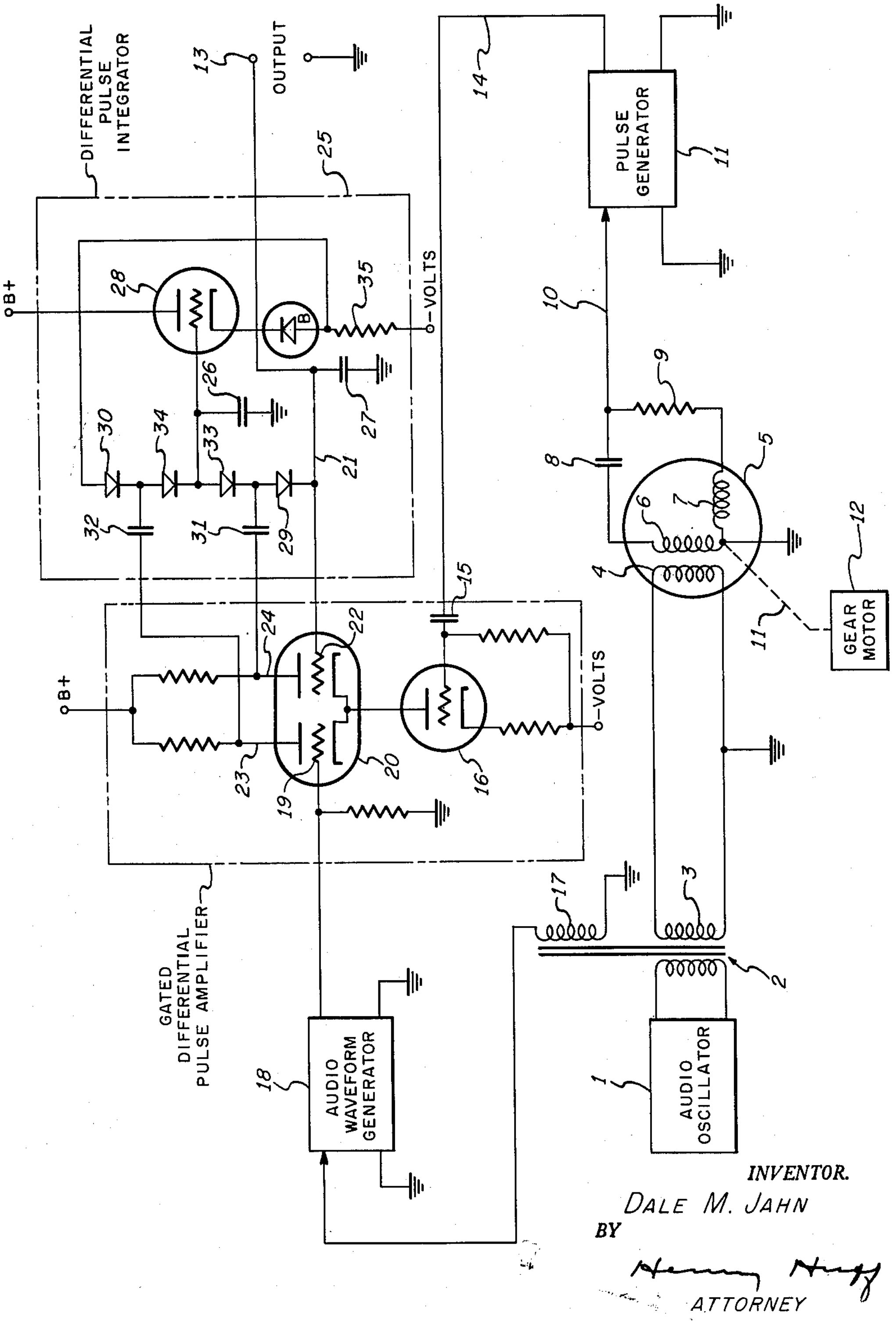
INVENTOR.
DALE M. JAHN
BY
Henry Hugg
ATTORNEY 3,085,206

VERY LOW FREQUENCY WAVEFORM GENERATOR

Dale M. Jahn, Garden City, N.Y., assignor to Sperry Rand Corporation, Great Neck, N.Y., a corporation of Delaware Filed July 17, 1961, Ser. No. 124,727
7 Claims. (Cl. 328—21)

The present invention generally relates to electronic waveform generators and, more particularly, to an electronic waveform generator adapted for the production of output signals having recurrence intervals of the order of seconds.

The generation of very low frequency waves has been a technical problem of substantial magnitude for many years. Proposed electronic devices which are designed in accordance with conventional techniques generally require circuit components which are bulky and expensive. Prior teachings also suggest the use of stabilized high gain direct current amplifiers because of the very low rates of change of the voltages and currents which are involved in the production of very low frequency waveforms. In an effort to avoid the inherent disadvantages associated with conventional electronic techniques, electromechanical mechanisms are sometimes resorted to. Such mechanisms, however, frequently are costly to fabricate and difficult to design.

It is the principal object of the present invention to provide a simplified electronic device for the generation of very low frequency waveforms.

Another object is to provide a very low frequency electronic waveform generator utilizing reliable components of convenient size and cost.

A further object is to provide an electronic low frequency waveform generator which avoids the necessity for stabilizing high gain direct current amplifiers.

These and other objects of the present invention, as will appear from a reading of the following specification, are achieved in a preferred embodiment by the provision of apparatus including an audio frequency oscillator producing a signal having a convenient frequency. In a typical case the audio oscillator may produce a sine wave of, say 400 cycles per second as compared to the ultimately desired very low frequency of, say, 1/12 cycle per second. The audio waveform is applied by means of respective coupling circuits to first and second inputs of a three input gated differential pulse amplifier.

One of the coupling circuits comprises an audio waveform generator for imparting a desired waveform to the sinusoidal signal. For example, the waveform generator may consist of a half wave rectifier for producing a succession of half sine waves in response to the sinusoidal signal. Alternatively, it may be desirable to utilize the sine wave directly as generated by the audio oscillator without modifying its shape. The precise wave shape of the audio signal as applied to the gated differential pulse amplifier is of no particular concern in the present invention.

In response to the sinusoidal signal, the second of the aforementioned coupling networks produces sampling pulses having a recurrence rate deviating by a small predetermined amount from the frequency of the audio waveform and couples said pulses to the gated differential pulse amplifier for actuating the same. In a preferred embodiment, the second coupling circuit includes an electromechanical resolver-phase shifter which is driven at a predetermined low angular rate by a low output speed gear motor. The phase shifted sine waves at the output of the phase shifter are applied to a pulse generator which produces a gating pulse at a predetermined point on each cycle of the phase shifted sine wave. Thus, the gating pulses recur at a rate deviating slightly from the frequency of the audio waveform by an amount dependent upon the rotational speed of the electromechanical phase shifter.

A differential pulse integrator is coupled to receive the outputs of the gated differential pulse amplifier. The output signal produced by the integrator is fed back to the third input of the gated differential pulse amplifier. Said amplifier compares the instantaneous amplitudes of the output signal and the audio waveform at the times of occurrence of the gating signal to produce a pair of output pulses whose amplitude differential, if any, is a measure of the difference in amplitude between the instantaneous amplitudes of the output signal and the audio waveform. The combination of the gated differential pulse amplifier and the differential pulse integrator together comprises an electronic servo integrator which makes the output signal equal to the audio waveform in amplitude during the times of occurrence of the sampling pulses. In this manner, an output signal is produced having a wave shape substantially identical to the desired wave shape of the input audio waveform but having a recurrence rate which can be made arbitrarily smaller than the recurrence rate of the audio waveform merely by reducing the speed at which the phase shifter is driven.

For a more complete understanding of the present invention, reference should be had to the following specification and to the sole FIGURE which is a simplified block diagram, partly schematic in presentation, of a preferred embodiment.

Referring to the FIGURE, the numeral 1 generally designates a source of audio signal of convenient frequency such as, for example, a sine wave at 400 cycles per second. The sine wave is coupled by transformer 2 and secondary 3 to the stator winding 4 of a conventional electromechanical resolver 5. The rotor windings 6 and 7 of resolver 5 are connected together by a conventional phase shift network comprising capacitor 8 and resistor 9 to produce on line 10 a sine wave having a frequency equal to that of the signal produced by oscillator 1 and a phase determined by the angular position of the rotor coils of resolver 5. The rotor coils are driven via the mechanical linkage 11 by gear motor 12. Motor 12 continuously rotates the resolver rotor at a predetermined low rate, for example, 1/12 revolution per second, in accordance with the desired repetition rate of the output signal appearing between the output terminal 13 and ground.

The phase shifted sine waves developed on line 10 are applied to pulse generator 11. Generator 11 may include, for example, a blocking oscillator which is designed to fire at a predetermined amplitude value of each cycle of the phase shifted sine waves. The pulses produced by generator 11 are applied by line 14 and coupling capacitor 15 to the grid of triode 16. It should be noted that the phase of the gating pulses appearing on line 14 continuously changes relative to the phase of the sine wave produced by oscillator 1 at a rate determined by the rotation of the rotor coils of resolver 5.

The sine wave produced by oscillator 1 is coupled by transformer 2 and secondary 17 to the input of audio waveform generator 18. The purpose of waveform generator 18 is to operate upon the amplitude of the sine wave generated by oscillator 1 to produce a predetermined wave shape. If it is desired that the predetermined wave shape be sinusoidal, then generator 18 would be merely an amplifier. The particular wave shape produced by generator 18 is of no significance in the present invention. The signal provided by generator 18 is coupled to grid 19 of differential amplifier tube 20.

Triode 16 is connected in series circuit with the cathodes of amplifier tube 20 whereby tube 20 is rendered conductive solely upon the actuation of triode 16. Triode 16, in turn, is actuated solely upon the occurrence of the continuously phase shifted gating pulses of line 14. The output signal appearing between output terminal 13 and ground is fed back by line 21 to grid 22 of gated differential pulse amplifier tube 20. Tube 20 produces a pair of negative-going output pulses at the respective plates thereof each time that it is rendered conductive by the application of a gating pulse to triode 16. The difference in amplitude between the negative-going output pulses is proportional to the difference between the instantaneous amplitudes of the output signal fed back to grid 22 and the waveform applied to grid 19 during the occurrences of the sampling pulses of line 14.

The negative-going pulses produced at the plates 23 and 24 of tube 20 are coupled to respective inputs of differential pulse integrator 25. Differential pulse integrator 25 may be similar in structure and operation to a conventional linear step circuit as disclosed, for example, in Waveforms, edited by Chance et al., McGraw-Hill Radiation Laboratories Series, volume 19, 1949, page 617. In essence, integrator 25 is a two-fold version of the prior art linear step circuit adapted for the summation or integration of the differences between input pulse pairs having amplitudes which vary either in an increasing or decreasing sense. Briefly, each of capacitors 31 and 32 are charged via respective charging circuits each time that tube 20 is rendered conductive by a gating pulse. Capacitor 31 is charged through a path including diode 33 and capacitor 26. Capacitor 32 is charged through a path including diode 30 and resistor 35. The pre-existing charge on capacitor 26 is changed during the conduction of diode 33 simultaneously with the charging of capacitor 31. After the gating pulse has terminated, capacitors 31 and 32 discharge, the latter discharging through diode 34 and capacitor 26. Thus, capacitor 26 is charged by the amount of charge placed on capacitor 31 and discharged by the amount of charge placed on capacitor 32. The net change of charge on capacitor 26 is proportional to the difference between the charges placed on capacitors 31 and 32 which, in turn, is proportional to the difference between the amplitudes of the negative-going pulses appearing at the respective plates of tube 20 during the occurrence of each gating pulse. The sense of the net change is determined by the sense of said difference. The net charge on capacitor 26 determines the current flow through cathode follower 28 and the potential between output terminal 13 and ground. In typical feedback fashion, the step wise varying signal developed across capacitor 27 and between output terminal 13 and ground is constrained to follow changes in amplitude (whether increasing or decreasing) of the waveform applied to grid 19.

From the preceding specification it will be seen that the objects of the present invention have been achieved by application of the principle of sampling the amplitude of a predetermined waveform of convenient frequency by sampling pulses having a recurrence rate differing from said convenient frequency by a small predetermined amount. The pulse sampling is accomplished by means of a gated differential pulse amplifier which also functions as part of a feedback system wherein the instantaneous amplitude of the desired output signal is constrained to follow the sampled instantaneous amplitude of said waveform of convenient frequency.

It will be observed by those skilled in the art that the disclosed embodiment is readily adapted for changing the frequency of the output signal appearing between output terminal 13 and ground merely by changing the speed at which rotor coils 6 and 7 of resolver 5 are driven by gear motor 12. The frequency of said output signal can be made arbitrarily small, approaching direct current, by reducing said speed. The frequency of the output signal becomes zero when rotor coils 6 and 7 of resolver 5 cease rotating.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A waveform generator comprising a source of recurrent signal, a gated differential pulse amplifier having two signal inputs and a gating input, means for coupling said recurrent signal to one of said signal inputs, means coupled to receive said recurrent signal for producing a series of gating pulses, said gating pulses recurring at a rate differing from the frequency of said recurrent signal by a predetermined amount, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

2. A waveform generator comprising a source of sinusoidal signal, a gated differential pulse amplifier having two signal inputs and a gating input, means for coupling said sinusoidal signal to one of said signal inputs, means coupled to receive said sinusoidal signal for producing a series of gating pulses, said gating pulses recurring at a rate differing from the frequency of said sinusoidal signal by a controllable amount, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

3. A waveform generator comprising a source of sinusoidal signal, a gated differential pulse amplifier having two signal inputs and a gating input, means for coupling said sinusoidal signal to one of said signal inputs, phase shifter means coupled to receive said sinusoidal signal for phase shifting said sinusoidal signal at a predetermined rate, means coupled to receive the phase shifted sinusoidal signal for producing gating pulses having a recurrence rate equal to that of said phase shifted sinusoidal signal, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

4. A waveform generator comprising a source of sinusoidal signal, a gated differential pulse amplifier having two signal inputs and a gating input, means for coupling said sinusoidal signal to one of said signal inputs, means including a rotatable resolver coupled to receive said sinusoidal signal for phase shifting said sinusoidal signal at a rate determined by the rotational speed of said resolver, means coupled to receive the phase shifted sinusoidal signal for producing gating pulses having a recurrence rate equal to that of said phase shifted sinusoidal signal, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

5. A waveform generator comprising a source of sinusoidal signal, a gated differential pulse amplifier having two signal inputs and a gating input, means for coupling said sinusoidal signal to one of said signal inputs, means including a rotatable resolver coupled to receive said sinusoidal signal for phase shifting said sinusoidal signal at a rate determined by the rotational speed of said resolver, means for continuously rotating said resolver at a predetermined speed, means coupled to receive the phase shifted sinusoidal signal for producing gating pulses having a recurrence rate equal to that of said phase shifted sinusoidal signal, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

6. A waveform generator comprising a source of sinusoidal signal, a gated differential pulse amplifier having two signal inputs and a gating input, waveform generator means for coupling said sinusoidal signal to one of said signal inputs, means including a rotatable resolver coupled to receive said sinusoidal signal for phase shifting said sinusoidal signal at a rate determined by the rotational speed of said resolver, means coupled to receive the phase shifted sinusoidal signal for producing gating pulses having a recurrence rate equal to that of said phase shifted sinusoidal signal, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

7. A waveform generator comprising a source of sinusoidal signal of audio frequency, a gated differential pulse amplifier having two signal inputs and a gating input, means for coupling said sinusoidal signal to one of said signal inputs, means including a rotatable resolver and a phase shift network coupled to receive said sinusoidal signal for phase shifting said sinusoidal signal at a rate determined by the rotational speed of said resolver, means coupled to receive the phase shifted sinusoidal signal for producing gating pulses having a recurrence rate equal to that of said phase shifted sinusoidal signal, said gating pulses being applied to said gating input of said gated differential pulse amplifier, and a differential pulse integrator connected to the output of said gated differential pulse amplifier, the output signal produced by said differential pulse integrator being applied to the other of said signal inputs of said gated differential pulse amplifier.

No references cited.